United States Patent
Guo et al.

(10) Patent No.: US 11,362,115 B2
(45) Date of Patent: Jun. 14, 2022

(54) ARRAY SUBSTRATE AND PREPARATION METHOD THEREFOR, AND DISPLAY PANEL AND DISPLAY DEVICE

(71) Applicants: Ordos Yuansheng Optoelectronics Co., Ltd., Inner Mongolia (CN); BOE Technology Group Co., Ltd., Beijing (CN)

(72) Inventors: Zhixuan Guo, Beijing (CN); Fengguo Wang, Beijing (CN); Yezhou Fang, Beijing (CN); Feng Li, Beijing (CN); Xinguo Wu, Beijing (CN); Hong Liu, Beijing (CN); Zifeng Wang, Beijing (CN); Lei Li, Beijing (CN); Kai Li, Beijing (CN); Liang Tian, Beijing (CN); Jing Zhao, Beijing (CN); Zhengkui Wang, Beijing (CN); Bo Ma, Beijing (CN); Haiqin Liang, Beijing (CN); Peng Liu, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/640,940

(22) PCT Filed: Mar. 22, 2019

(86) PCT No.: PCT/CN2019/079340
§ 371 (c)(1),
(2) Date: Feb. 21, 2020

(87) PCT Pub. No.: WO2019/196632
PCT Pub. Date: Oct. 17, 2019

(65) Prior Publication Data
US 2020/0212071 A1    Jul. 2, 2020

(30) Foreign Application Priority Data

Apr. 9, 2018    (CN) .......................... 201810312699.3

(51) Int. Cl.
*H01L 27/12* (2006.01)
*G06F 3/041* (2006.01)

(52) U.S. Cl.
CPC .......... *H01L 27/124* (2013.01); *G06F 3/0412* (2013.01); *G06F 2203/04103* (2013.01)

(58) Field of Classification Search
CPC .... G06F 3/047; G06F 3/0443; G06F 3/04166; G06F 3/0412; H01L 27/323
See application file for complete search history.

(56) References Cited

U.S. PATENT DOCUMENTS

2010/0225860 A1    9/2010   Huang et al.
2011/0254795 A1*  10/2011   Chen .................... G06F 3/0412
                                                  345/173

(Continued)

FOREIGN PATENT DOCUMENTS

CN    101825816 A    9/2010
CN    102969282 A    3/2013

(Continued)

OTHER PUBLICATIONS

Chinese Office Action in corresponding application No. 201810312699.3 dated Mar. 16, 2020.

(Continued)

*Primary Examiner* — Parul H Gupta
(74) *Attorney, Agent, or Firm* — ArentFox Schiff LLP; Michael Fainberg

(57) ABSTRACT

The present disclosure relates to the technical field of display. Disclosed are an array substrate and a preparation method therefor, and a display panel and a display device. The array substrate includes: a substrate; multiple gate lines, (Continued)

wherein the gate lines are located on the substrate, and extend along a first direction; multiple data lines, wherein the data lines are located on the substrate, and extend along a second direction, and the gate lines and the data lines intersect to define multiple pixel areas; and a touch-control electrode wiring wherein the touch-control electrode wiring has the same direction as that of the gate lines, and is arranged insulated from the gate lines on a different layer, and the orthographic projection of the touch-control electrode wiring on the substrate at least has an overlapping area with the orthographic projection of part of the gate lines on the substrate.

3 Claims, 3 Drawing Sheets

(56) References Cited

U.S. PATENT DOCUMENTS

| | | | |
|---|---|---|---|
| 2017/0090636 A1* | 3/2017 | Ding | G06F 3/0412 |
| 2017/0160852 A1* | 6/2017 | Ahn | G06F 3/047 |
| 2017/0168617 A1* | 6/2017 | Qu | G06F 3/0445 |
| 2017/0269746 A1* | 9/2017 | He | G06F 3/0448 |
| 2018/0188858 A1 | 7/2018 | Zhang et al. | |
| 2018/0196536 A1 | 7/2018 | Li et al. | |
| 2018/0252956 A1 | 9/2018 | Shin et al. | |
| 2019/0204964 A1* | 7/2019 | Wang | G06F 3/0412 |
| 2019/0227671 A1 | 7/2019 | Hu et al. | |
| 2020/0212071 A1 | 7/2020 | Guo et al. | |

FOREIGN PATENT DOCUMENTS

| | | | |
|---|---|---|---|
| CN | 103176302 A | 6/2013 | |
| CN | 105788466 A | 7/2016 | |
| CN | 105845033 A | 8/2016 | |
| CN | 205679878 U | 11/2016 | |
| CN | 107315296 A | 11/2017 | |
| CN | 107515701 A | 12/2017 | |
| CN | 108428705 A | 8/2018 | |
| WO | WO-2016201838 A1 * | 12/2016 | G02F 1/133345 |

OTHER PUBLICATIONS

Chinese Office Action in corresponding application No. 201810312699.3 dated Jul. 14, 2020.

* cited by examiner

ARRAY SUBSTRATE AND PREPARATION METHOD THEREFOR, AND DISPLAY PANEL AND DISPLAY DEVICE

The present disclosure is a US National Stage of International Application No. PCT/CN2019/079340, filed Mar. 22, 2019, which claims the priority to Chinese Patent Application No. 201810312699.3, titled "array substrate and preparation method therefor, and display panel and display device" filed with the Chinese Patent Office on Apr. 9, 2018. All contents disclosed herein are incorporated in the present disclosure by reference.

FIELD

The present disclosure relates to the field of display and in particular relates to an array substrate and a preparation method therefor, and a display panel and a display device.

BACKGROUND

Products of a Full in Cell (FIC) touch-control structure and with a high pixel and a high opening rate have been the major development of current Low Temperature Poly Silicon (LTPS) liquid crystal display panels. However, with the increasing number of pixels, the design of the current FIC liquid crystal products certainly faces the dilemma of insufficient opening rate.

SUMMARY

In a first aspect, an embodiment of the present disclosure provides an array substrate, including: a substrate; a plurality of gate lines located on the substrate and extending in a first direction; a plurality of data lines located on the substrate and extending in a second direction, where the gate lines and the data lines intersect to define multiple pixel areas; and a plurality of touch-control electrode wirings extending in the same direction with the gate lines and being insulated from the gate lines on a different layer, where the orthographic projection of the touch-control electrode wirings on the substrate at least has an overlapped area with the orthographic projection of a part of the gate lines on the substrate.

In a possible embodiment, in the array substrate provided by the embodiment of the present disclosure, the touch-control electrode wirings are arranged in one-to-one correspondence to the gate lines.

In a possible embodiment, in the array substrate provided by the embodiment of the present disclosure, the touch-control electrode wirings include first-layer wirings and second-layer wirings, where materials of the first-layer wirings include metal materials and materials of the second-layer wirings include conductive protection materials.

In a possible embodiment, in the array substrate provided by the embodiment of the present disclosure, width of the touch-control electrode wirings is smaller than width of the gate lines.

In a possible embodiment, in the array substrate provided by the embodiment of the present disclosure, the array substrate further includes: touch-control electrodes electrically connected to the touch-control electrode wirings.

In a possible embodiment, in the array substrate provided by the embodiment of the present disclosure, the array substrate further comprises one or more insulating layers located between a touch-control electrode wiring layer and the touch-control electrodes; and the touch-control electrode wirings are electrically connected to the touch-control electrodes through via holes located in the insulating layers.

In a possible embodiment, in the array substrate provided by the embodiment of the present disclosure, the array substrate further includes pixel electrodes located in the pixel areas, where driving electrical fields are formed between the pixel electrodes and common electrodes.

In a possible embodiment, in the array substrate provided by the embodiment of the present disclosure, the touch-control electrodes are multiplexed as the common electrodes.

In a second aspect, an embodiment of the present disclosure further provides a display panel, including the array substrate provided by any embodiment of the first aspect.

In a third aspect, an embodiment of the present disclosure further provides a display device, including the display panel provided by the embodiment of the second aspect.

In a fourth aspect, an embodiment of the present disclosure further provides a preparation method of an array substrate. The method includes: forming a grid line layer on a substrate, and a plurality of gate lines with a composition process; and forming a plurality of touch-control electrode wirings on the gate lines, where the orthographic projection of the touch-control electrode wirings on the substrate at least has an overlapped area with the orthographic projection of a part of the gate lines on the substrate.

In a possible embodiment, in the preparation method of the array substrate provided by the embodiment of the present disclosure, the preparation method further includes: forming insulating layers on the touch-control electrode wirings, and forming via holes in the insulating layers with a composition process; and forming a touch-control electrode layer on the insulating layers in which the via holes are formed, and forming touch-control electrode with the composition process, where the touch-control electrodes are electrically connected to the touch-control electrode wirings through the via holes.

In a possible embodiment, in the preparation method of the array substrate provided by the embodiment of the present disclosure, the forming the touch-control electrode wirings on gate lines includes: forming first-layer wiring layers on the gate lines, where materials of the first-layer wiring layer include metal materials; forming a second-layer wiring layer on the first-layer wiring layers, where materials of the second-layer wiring layer include conductive protection materials; and forming the touch-control electrode wirings with the composition process, where the touch-control electrode wirings include a double-layer structure including first-layer wirings and second-layer wirings.

DETAILED DESCRIPTION OF THE EMBODIMENTS

Accompanying figures in embodiments of the present disclosure will be incorporated below to describe a solution in the embodiments of the present disclosure clearly and completely. Obviously, the embodiments described are merely a part of embodiments of the present disclosure rather than all embodiments. Based on the embodiments of the present disclosure, all other embodiments obtained by those ordinary skilled in the art under the precondition of not paying any inventive labor should belong to the scope of the present disclosure.

Please refer to FIGS. 1-6.

Figure 1:
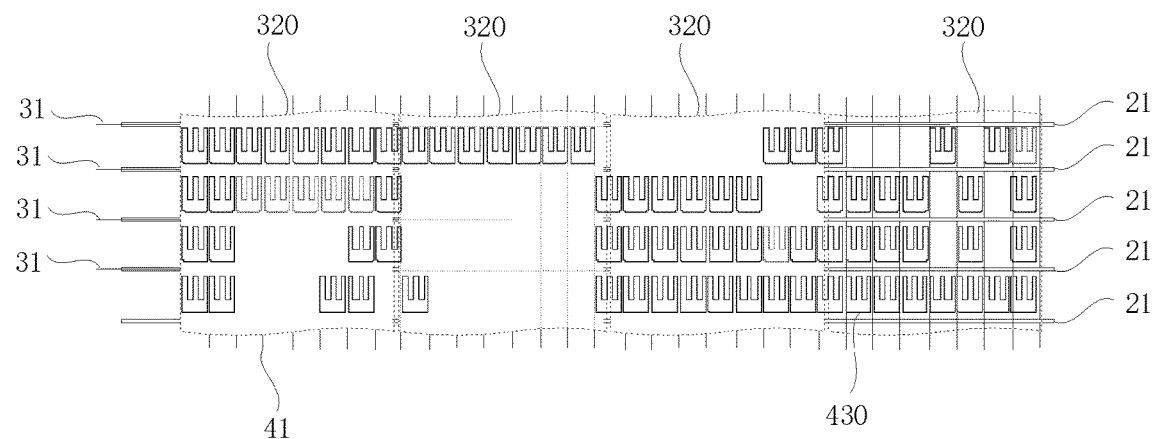
FIG. 1 is a part of structure diagram for an array substrate provided by an embodiment of the present disclosure.
Figure 2:
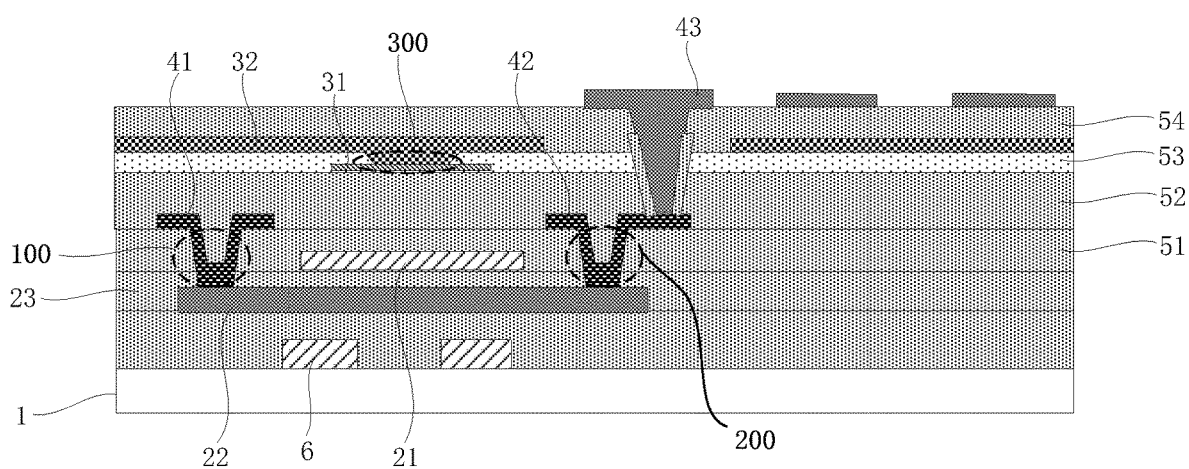
FIG. 2 is a profile structure diagram for a sub-pixel area of the array substrate provided by the embodiment of the present disclosure.

As shown in FIGS. 1 and 2, an embodiment of the present disclosure discloses an array substrate, including: a substrate 1, a plurality of gate lines 21, a plurality of data lines 41, and a plurality of touch-control electrode wirings 31.

The plurality of gate lines 21 are located on the substrate 1 and extending in a first direction.

The plurality of data lines 41 are located on the substrate 1 and extending in a second direction. The gate lines 21 and the data lines 41 intersect to define a plurality of pixel areas.

The plurality of touch-control electrode wirings 31 are extending in the same direction with the gate lines 21 and disposed insulated from the gate lines 21 on a different layer. The orthographic projection of the touch-control electrode wirings 31 on the substrate 1 at least has an overlapped area with the orthographic projection of a part of the gate lines 21 on the substrate 1.

The touch-control electrode wirings 31 are arranged in the array substrate provided by the embodiment of the present disclosure, i.e. a touch-control structure is arranged in the array substrate, which may be used for preparing an full in cell (FIC) touch-control display panel. In particular, the touch-control electrode wirings 31 and the gate lines 21 in the array substrate extend in a first direction of a pixel array and are formed on the substrate 1 in a stacked manner. That is, upon being overlooked, the touch-control electrode wirings 31 and the gate lines 21 extend consistently and at least overlap partially, thus, compared with the design of disposing the touch-control electrode wirings 31 and the data lines 41 on the same layer in the related art, the area of a display area occupied by signal lines in the array substrate structure is small, the opening rate of pixels is large and it is less likely for the situation of short circuit between the touch-control electrode wirings 31 and the data lines 41 to occur. Therefore, the opening rate of the array substrate provided by the embodiment of the present disclosure is high, so that the problem of poor signal transmission of the data lines and the touch-control electrode wirings may be avoided. Further, the array substrate may be used for realizing FIC touch-control display products with a high pixel per inch (PPI) and high opening rate.

In some embodiments, as shown in FIG. 2, a first insulating layer 51 and a second insulating layer 52 are arranged between a grid line layer and a touch-control electrode wiring layer to ensure the grid line layer to be mutually insulated from the touch-control electrode wiring layer.

As shown in FIG. 1, the array substrate provided by the embodiments of the present disclosure further includes a plurality of data lines 41. The data lines 41 are arranged on the substrate 1, and extend in a row direction of the pixel array. The multiple data lines 41 intersect with the gate lines 21 for wiring layout. Sub-pixels are arranged in a matrix shape in areas divided by the data lines 41 and the gate lines 21.

In particular, as shown in FIG. 2, the array substrate provided by the embodiments of the present disclosure further includes thin film transistors (TFTs) in one-to-one correspondence to the sub-pixels. Each of the TFTs includes a semiconductor layer 22, a gate insulating layer 23 and gate lines 21. Optionally, in each of the sub-pixels, the data lines 41 are electrically connected to a source-electrode area of the semiconductor layer 22 by a via hole running through the gate insulating layer 23 and the first insulating layer 51; a landing electrode 42 is electrically connected to a drain-electrode area of the semiconductor layer 22 by a via hole running through the gate insulating layer 23 and the first insulating layer 51; and a pixel electrode 43 is arranged on the landing electrode 42, and the pixel electrode 43 is electrically connected to the landing electrode 42 by a via hole running through the second insulating layer 52, an insulating layer 53 and a fourth insulating layer 54, thus, the pixel electrode 43 may be connected to the drain-electrode of the semiconductor layer 22 through the landing electrode 42. Optionally, the array substrate may be a low temperature poly-silicon (LTPS) array substrate, i.e. the semiconductor layers 22 of the TFTs are made of LTPS materials. Moreover, a light shield layer 6 may be further arranged between the semiconductor layer 22 and a glass substrate 1.

Optionally, in the array substrate provided by the embodiments of the present disclosure, the touch-control electrode wirings 31 are arranged in one-to-one correspondence to the gate lines 21.

As shown in FIG. 1, in the array substrate provided by the embodiments of the present disclosure, a plurality of touch-control electrode blocks 320 are arranged on the substrate 1 in an array shape. Each of the touch-control electrode blocks 320 covers multiple pixel areas in a row direction of a pixel array. In particular, each of the touch-control electrode blocks 320 is connected to a touch-control chip via one or more of the touch-control electrode wirings 31.

Optionally, in the array substrate provided by the embodiments of the present disclosure, the touch-control electrode wirings 31 include first-layer wirings and second-layer wirings arranged in a stacked manner. Materials of the first-layer wirings include metal materials, and materials of the second-layer wirings include conductive protection materials.

In particular, in the array substrate provided by the embodiments of the present disclosure, the metal materials are adopted for the first-layer wirings may effectively reduce resistance of the touch-control electrode wirings. In order to protect the metal materials, the touch-control electrode wirings further include the second-layer wirings formed with the conductive protection materials, so as to improve stability of the touch-control electrode wirings.

In the embodiments of the present disclosure, the materials of the first-layer wirings in the touch-control electrode wirings may include metal silver, which may reduce resistance of the wirings. Due to instability of single-substance silver, the second-layer wirings are arranged on the first-layer wirings, where the materials of the second-layer wirings may include indium tin oxide (ITO), to improve stability of the touch-control electrode wirings.

Optionally, thickness of a first-layer wiring layer may be 1500 angstroms, and thickness of a second-layer wiring layer may be 100 angstroms.

Optionally, in the array substrate provided by the embodiments of the present disclosure, width of the touch-control electrode wirings 31 is smaller than width of the gate lines 21.

In particular, in the array substrate provided by the embodiments of the present disclosure, the projection of the touch-control electrode wirings 31 on the substrate 1 may completely fall within the projection of the gate lines 21 on the substrate 1. Therefore, the opening rate of the array substrate of the embodiments of the present disclosure is high.

Optionally, the width of the touch-control electrode wirings 31 may be 1 um (micron) smaller than the width of the gate lines 21. For example, in the array substrate of the embodiment, the width of the gate lines 21 may be 3.5 um, the width of the touch-control electrode wirings 31 may be 2.5 um, and two sides of the touch-control electrode wirings 31 respectively have a distance of 0.5 um from two sides of the gate lines 21.

In a specific embodiment, as shown in FIG. 2, the array substrate provided by the embodiment of the present disclosure further includes touch-control electrodes 32 electrically connected to the touch-control electrode wirings 31.

In particular, the array substrate provided by the embodiments of the present disclosure further includes an insulating layer 53 located between a touch-control electrode layer and the touch-control electrode wiring layer. The touch-control electrode wirings 31 are electrically connected to the touch-control electrodes 32 through via holes located in the insulating layer 53.

More particularly, as shown in FIG. 1, the touch-control electrodes may include a plurality of electrode blocks 320. Each of the electrode blocks 320 performs signal transmission with a touch-control chip through the touch-control electrode wirings 31, to realize a touch-control function. Optionally, the touch-control electrode blocks 320 are prepared with ITO and transparent.

In particular, the array substrate provided by the embodiments of the present disclosure, as shown in FIG. 2, further includes pixel electrodes 43 arranged in the pixel areas. Driving electrical fields are formed between the pixel electrodes 43 and common electrodes.

Optionally, in the array substrate provided by the embodiments of the present disclosure, the touch-control electrodes are multiplexed as the common electrodes.

As shown in FIGS. 1 and 2, the touch-control electrodes 32 are further used as the common electrodes. Optionally, a touch-control scanning signal and a display scanning signal may be applied to the touch-control electrode blocks 320 in a time-share manner within a frame time, to realize a touch-control function and a display function thereof through time division multiplexing.

In particular, in the array substrate provided by the embodiments of the present disclosure, the pixel electrodes 43 are formed on a glass substrate 1 according to a manner of electrode blocks 430 corresponding to sub-pixels, and the pixel electrode blocks 430 at least partially overlap with the touch-control electrode blocks 320 while being overlooked. In particular, while using the touch-control electrode blocks 320 as the common electrodes, driving electrical fields may be formed between the pixel electrode blocks 430 and the touch-control electrode blocks 320, to drive deflection of liquid crystal molecules, thus displaying corresponding sub-pixels. Optionally, the pixel electrodes 43 are prepared with ITO and transparent.

An embodiment of the present disclosure further provides a display panel, including the array substrate of the above embodiments. In particular, the display panel is an FIC touch-control display panel having a high opening rate. Moreover, it is less likely to generate x-line failure. Therefore, high PPI design may be realized. In an embodiment, the display panel is a liquid crystal display panel and further includes opposed substrates, such as color film substrates. The substrates and the array substrate are oppositely arranged to form a liquid crystal display panel.

An embodiment of the present disclosure further provides a display device, including the display panel of the above embodiments. The display device may be a mobile phone, a tablet PC, a television, a display, a laptop, a digital photo frame, a navigator and any other product or component having a display function.

Figure 3:
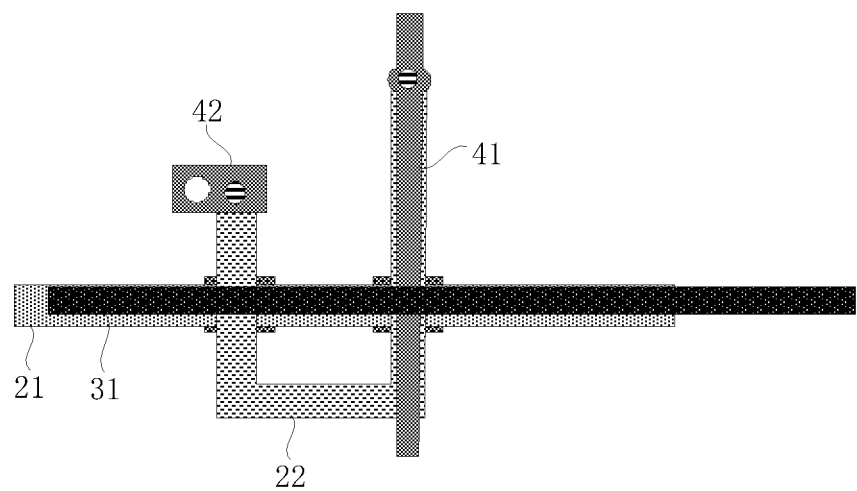
FIG. 3 is a part of area overlook structure diagram for the array substrate provided by the embodiment of the present disclosure.
Figure 4:
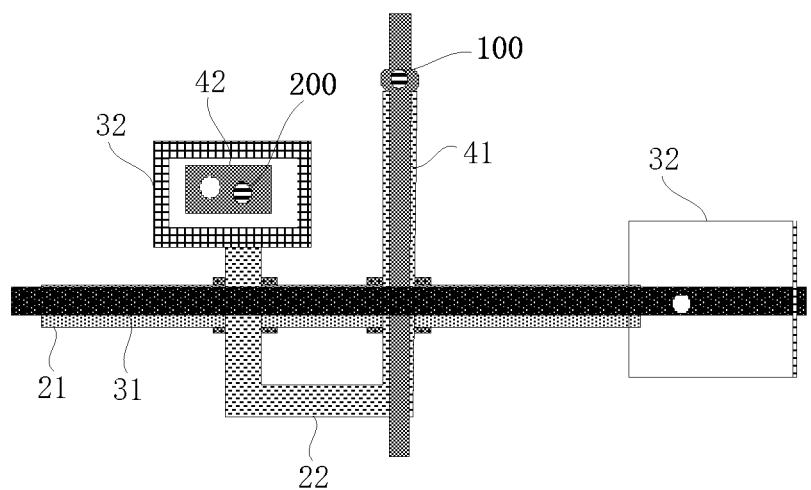
FIG. 4 is a part of area overlook structure diagram for an array substrate provided by another embodiment of the present disclosure.
Figure 5:
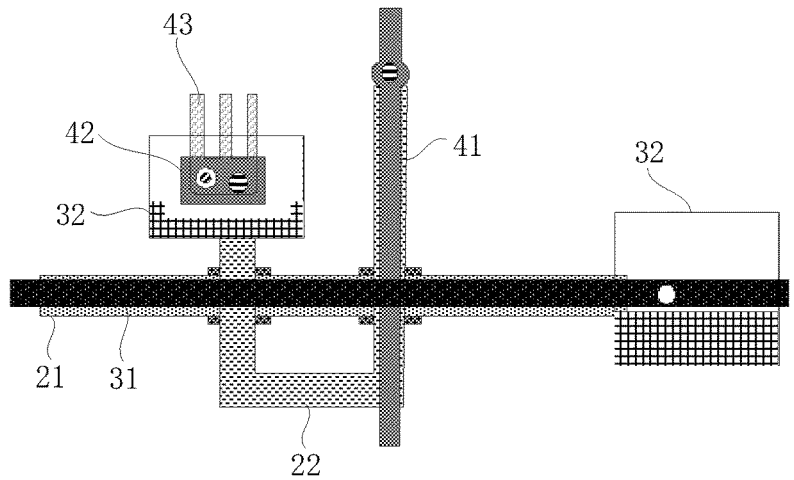
FIG. 5 is a part of area overlook structure diagram for an array substrate provided by one more another embodiment of the present disclosure.
Figure 6:
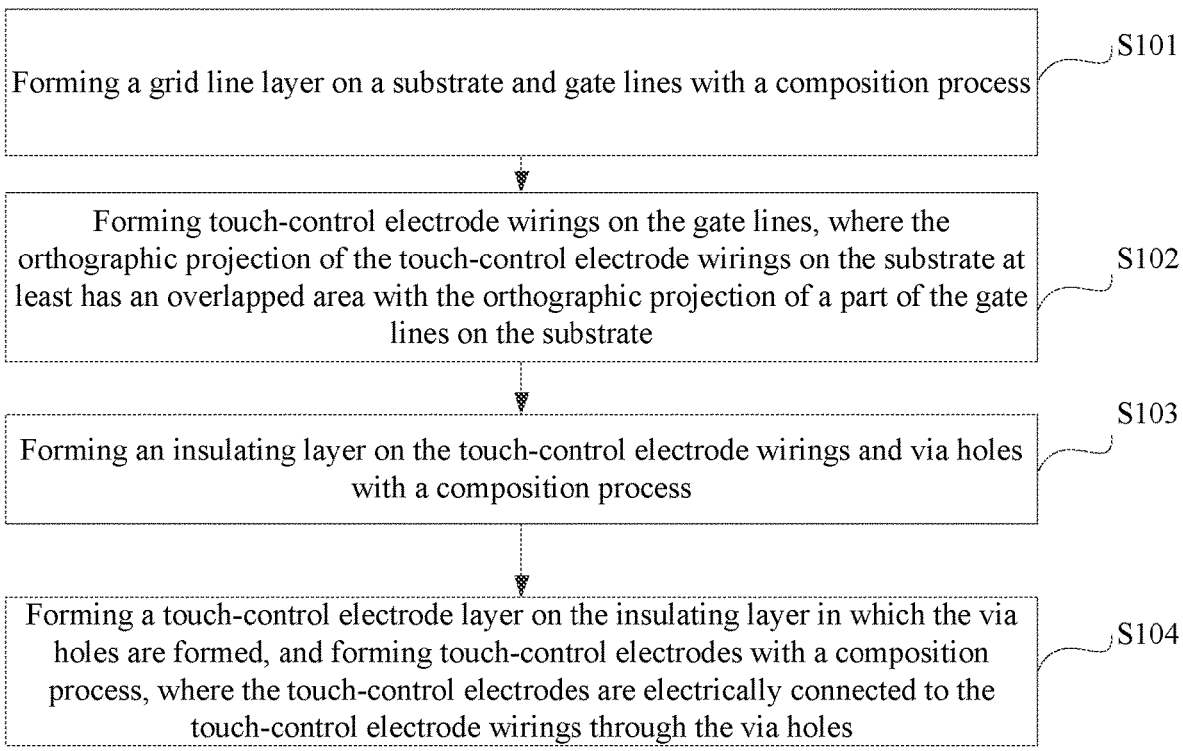
FIG. 6 is a flow chart of a preparation method of the array substrate provided by the embodiment of the present disclosure.

As shown in FIGS. 3-5, based on the array substrate provided by the embodiments of the present disclosure, an embodiment of the present disclosure further provides a preparation method of the array substrate. The method includes the following steps as shown in FIG. 6.

Step S101, forming a grid line layer on a substrate, and forming gate lines 21 with a composition process.

Step S102, forming touch-control electrode wirings 31 on the gate lines 21. The orthographic projection of the touch-control electrode wirings 31 on the substrate 1 at least has an overlapped area with the orthographic projection of a part of the gate lines 21 on the substrate 1.

As shown in FIGS. 3-5, in a specific embodiment, prior to forming the touch-control electrode wirings 31, the preparation method of the embodiments of the present disclosure may further include the following operations.

Forming semiconductor layers 22, source-drain electrode landing layers (including data lines 41 and landing electrodes 42), and insulating films between respective layers, etc.

As shown in FIG. 4, in a specific embodiment, after forming the touch-control electrode wirings 31, the preparation method of the embodiments of the present disclosure may further include the following steps as shown in FIG. 6.

Step S103, forming an insulating layer 53 on the touch-control electrode wirings 31, and forming via holes in the insulating layer 53 with a composition process.

Step S104, forming a touch-control electrode layer on the insulating layer in which the via holes are formed, and forming touch-control electrodes 32 with a composition process. The touch-control electrodes 32 are electrically connected to the touch-control electrode wirings 31 through the via holes.

Optionally, the above insulating layer may be made of SiNx materials and thickness thereof may be around 2000 angstroms.

As shown in FIG. 5, in a specific embodiment, after forming the touch-control electrodes 32, the preparation method of the embodiments of the present disclosure may further include the following operation of: forming a pixel electrode layer on the substrate and a pattern of pixel electrodes 43 through a composition process.

In a specific embodiment, the touch-control electrode wirings may include a dual-layer structure of a first-layer wiring and a second-layer wiring. The first-layer wiring includes silver metal materials, and the second-layer wiring includes ITO materials, which may be formed with the following operations: forming a first-layer wiring layer on the gate lines; forming a second-layer wiring layer on the first-layer wiring layer; and forming the touch-control electrode wirings with a composition process. The touch-control electrode wirings include the first-layer wirings and the second-layer wirings.

In a specific embodiment, thickness of a first-layer wiring layer may be 1500 angstroms, and thickness of a second-layer wiring layer may be 100 angstroms.

As shown in FIGS. 3-5, in a specific embodiment, one of the touch-control electrode wirings 31 is stacked on each of the gate lines 21.

In particular, width of the touch-control electrode wirings 31 is smaller than width of the gate lines 21. Further, the projection of the touch-control electrode wirings 31 on the substrate may completely fall within the projection of the gate lines 21 on the substrate. Therefore, the opening rate of the array substrate of the embodiments of the present disclosure is high.

Optionally, the width of the touch-control electrode wirings 31 may be 1 um smaller than the width of the gate lines 21. For example, in the array substrate of the embodiment, the width of the gate lines 21 may be 3.5 um, the width of the touch-control electrode wirings 31 may be 2.5 um, and two sides of the touch-control electrode wirings 31 respectively have a distance of 0.5 um from two sides of the gate lines 21.

In particular, the composition process in the embodiments of the present disclosure may include exposure, develop, etching, peeling and other conventional processes. In addition, each of numbers in the embodiment of the present disclosure is disposed as an example for explanation and it is not restricted to the number in an actual design.

Obviously, those skilled in the art can make various modifications and variations to the embodiments of the present disclosure without departing from the spirit and scope of the present disclosure. By doing this, if these modifications and variations to the present disclosure belong to the claims of the present disclosure and the range of equivalent techniques thereof, the present disclosure also intends to include these modifications and variations inside.

The invention claimed is:

1. An array substrate, comprising:
a substrate;
a semiconductor layer, located on the substrate, wherein the semiconductor layer is made of low temperature poly-silicon (LTPS) materials, the semiconductor layer is U-shaped, the semiconductor layer comprises a bottom extending in a first direction, and a first extension portion and a second extension portion extending in a second direction, wherein the first direction is perpendicular to the second direction;
a gate insulating layer, located on and being in contact with the semiconductor layer;
a plurality of gate lines, extending in the first direction, and overlapping the first extension portion and the second extension portion of the semiconductor layer respectively;
a first insulating layer, located on the gate lines and covering the gate lines and the gate insulating layer, wherein the gate lines are located between the first insulating layer and the gate insulating layer, and the first insulating layer and the gate insulating layer are arranged in stacked contact wherein the first insulating layer and the gate insulating layer have a first via hole and a second via hole penetrating through the first insulating layer and the gate insulating layer, the first via hole exposes a source-electrode area of the semiconductor layer, and the second via hole exposes a drain-electrode area of the semiconductor layer;
a plurality of data lines and a landing electrode, wherein the data lines are located on the first insulating layer and located on the second extension portion of the semiconductor layer, and an extending direction of the data lines is the same as the second direction, wherein the data lines overlaps with the second extension portion and the gate lines; wherein an overlapping region of the data lines and the second extension portion extends into the first via hole and is connected to the source-electrode area of the semiconductor layer exposed by the first via hole; wherein the landing electrode is located on the first insulating layer, and has an overlapping region with the first extension portion, wherein the overlapping region of the landing electrode and the first extension portion extends into the second via hole and is connected to the drain-electrode area of the semiconductor layer exposed by the second via hole;
a second insulating layer, located on the first insulating layer and covering the data lines and the landing electrode;
a plurality of touch-control electrode wirings, located on the second insulating layer and the gate lines, and extending in the same direction as an extending direction of the gate lines; wherein an orthographic projection of the touch-control electrode wirings on the substrate is located within an orthographic projection of the gate lines on the substrate; wherein the touch-control electrode wirings comprises first-layer wirings and second-layer wirings arranged in a stacked manner, materials of the first-layer wirings comprise metal silver and materials of the second-layer wirings comprise indium tin oxide (ITO);
a third insulating layer, located on the second insulating layer and covering the touch-control electrode wirings, wherein the third insulating layer has a third via hole exposing the touch-control electrode wirings, and the third via hole exposing the touch-control electrode wirings does not overlap with the semiconductor layer; and
a touch-control electrode, located on the third insulating layer, wherein a portion of the touch-control electrode, extending into the third via hole exposing the touch-control electrode wirings, is connected to the touch-control electrode wirings; and the touch-control electrode is multiplexed as a common electrode.

2. A display panel, comprising an array substrate, wherein the array substrate comprises:
a substrate;
a semiconductor layer, located on the substrate, wherein the semiconductor layer is made of low temperature poly-silicon (LTPS) materials, the semiconductor layer is U-shaped, the semiconductor layer comprises a bottom extending in a first direction, and a first extension portion and a second extension portion extending in a second direction, wherein the first direction is perpendicular to the second direction;
a gate insulating layer, located on and being in contact with the semiconductor layer;
a plurality of gate lines, extending in the first direction, and overlapping the first extension portion and the second extension portion of the semiconductor layer respectively;
a first insulating layer, located on the gate lines and covering the gate lines and the gate insulating layer, wherein the gate lines are located between the first insulating layer and the gate insulating layer, and the first insulating layer and the gate insulating layer are arranged in stacked contact wherein the first insulating layer and the gate insulating layer have a first via hole and a second via hole penetrating through the first insulating layer and the gate insulating layer, the first via hole exposes a source-electrode area of the semiconductor layer, and the second via hole exposes a drain-electrode area of the semiconductor layer;

a plurality of data lines and a landing electrode, wherein the data lines are located on the first insulating layer and located on the second extension portion of the semiconductor layer, and an extending direction of the data lines is the same as the second direction, wherein the data lines overlaps with the second extension portion and the gate lines; wherein an overlapping region of the data lines and the second extension portion extends into the first via hole and is connected to the source-electrode area of the semiconductor layer exposed by the first via hole; wherein the landing electrode is located on the first insulating layer, and has an overlapping region with the first extension portion, wherein the overlapping region of the landing electrode and the first extension portion extends into the second via hole and is connected to the drain-electrode area of the semiconductor layer exposed by the second via hole;

a second insulating layer, located on the first insulating layer and covering the data lines and the landing electrode;

a plurality of touch-control electrode wirings, located on the second insulating layer and the gate lines, and extending in the same direction as an extending direction of the gate lines; wherein an orthographic projection of the touch-control electrode wirings on the substrate is located within an orthographic projection of the gate lines on the substrate; wherein the touch-control electrode wirings comprises first-layer wirings and second-layer wirings arranged in a stacked manner, materials of the first-layer wirings comprise metal silver and materials of the second-layer wirings comprise indium tin oxide (ITO);

a third insulating layer, located on the second insulating layer and covering the touch-control electrode wirings, wherein the third insulating layer has a third via hole exposing the touch-control electrode wirings, and the third via hole exposing the touch-control electrode wirings does not overlap with the semiconductor layer; and a touch-control electrode, located on the third insulating layer, wherein a portion of the touch-control electrode, extending into the third via hole exposing the touch-control electrode wirings, is connected to the touch-control electrode wirings; and the touch-control electrode is multiplexed as a common electrode.

3. A display device, comprising a display panel, wherein the display panel comprises an array substrate, and the array substrate comprises:

a substrate;

a semiconductor layer, located on the substrate, wherein the semiconductor layer is made of low temperature poly-silicon (LTPS) materials, the semiconductor layer is U-shaped, the semiconductor layer comprises a bottom extending in a first direction, and a first extension portion and a second extension portion extending in a second direction, wherein the first direction is perpendicular to the second direction;

a gate insulating layer, located on and being in contact with the semiconductor layer;

a plurality of gate lines, extending in the first direction, and overlapping the first extension portion and the second extension portion of the semiconductor layer respectively;

a first insulating layer, located on the gate lines and covering the gate lines and the gate insulating layer, wherein the gate lines are located between the first insulating layer and the gate insulating layer, and the first insulating layer and the gate insulating layer are arranged in stacked contact wherein the first insulating layer and the gate insulating layer have a first via hole and a second via hole penetrating through the first insulating layer and the gate insulating layer, the first via hole exposes a source-electrode area of the semiconductor layer, and the second via hole exposes a drain-electrode area of the semiconductor layer;

a plurality of data lines and a landing electrode, wherein the data lines are located on the first insulating layer and located on the second extension portion of the semiconductor layer, and an extending direction of the data lines is the same as the second direction, wherein the data lines overlaps with the second extension portion and the gate lines; wherein an overlapping region of the data lines and the second extension portion extends into the first via hole and is connected to the source-electrode area of the semiconductor layer exposed by the first via hole; wherein the landing electrode is located on the first insulating layer, and has an overlapping region with the first extension portion, wherein the overlapping region of the landing electrode and the first extension portion extends into the second via hole and is connected to the drain-electrode area of the semiconductor layer exposed by the second via hole;

a second insulating layer, located on the first insulating layer and covering the data lines and the landing electrode;

a plurality of touch-control electrode wirings, located on the second insulating layer and the gate lines, and extending in the same direction as an extending direction of the gate lines; wherein an orthographic projection of the touch-control electrode wirings on the substrate is located within an orthographic projection of the gate lines on the substrate; wherein the touch-control electrode wirings comprises first-layer wirings and second-layer wirings arranged in a stacked manner, materials of the first-layer wirings comprise metal silver and materials of the second-layer wirings comprise indium tin oxide (ITO);

a third insulating layer, located on the second insulating layer and covering the touch-control electrode wirings, wherein the third insulating layer has a third via hole exposing the touch-control electrode wirings, and the third via hole exposing the touch-control electrode wirings does not overlap with the semiconductor layer; and a touch-control electrode, located on the third insulating layer, wherein a portion of the touch-control electrode, extending into the third via hole exposing the touch-control electrode wirings, is connected to the touch-control electrode wirings; and the touch-control electrode is multiplexed as a common electrode.

* * * * *